United States Patent [19]

Kamuro

[11] Patent Number: 4,536,859
[45] Date of Patent: Aug. 20, 1985

[54] CROSS-COUPLED INVERTERS STATIC RANDOM ACCESS MEMORY

[75] Inventor: Setsufumi Kamuro, Yamatokoriyama, Japan

[73] Assignee: Sharp Kabushiki Kaisha, Osaka, Japan

[21] Appl. No.: 412,378

[22] Filed: Aug. 27, 1982

[30] Foreign Application Priority Data

Aug. 31, 1981 [JP] Japan .................................. 56-137923
Aug. 31, 1981 [JP] Japan .................................. 56-137924
Jun. 7, 1982 [JP] Japan .................................. 57-98181

[51] Int. Cl.$^3$ .............................................. G11C 13/00
[52] U.S. Cl. .................................... 365/154; 365/156; 365/190
[58] Field of Search ............... 365/154, 156, 190, 174, 365/182, 189

[56] References Cited

U.S. PATENT DOCUMENTS

| | | | |
|---|---|---|---|
| 4,404,657 | 9/1983 | Furuyama et al. | 365/154 |
| 4,419,744 | 12/1983 | Rutter | 365/154 |
| 4,420,821 | 12/1983 | Hoffmann | 365/154 |

*Primary Examiner*—Terrell W. Fears
*Attorney, Agent, or Firm*—Birch, Stewart, Kolasch & Birch

[57] ABSTRACT

A static random access memory (RAM) includes a flip-flop for storing data which contains a pair of cross-coupled inverters, a data line, a single MOS transistor connected between the flip-flop and the data line for selecting a RAM cell and for reading/writing data, a word line for carrying a signal applied to the gate of the MOS transistor, and a circuit for applying a voltage to the word line, the signal being higher in a read operation of the data than that in a write operation of the data. Only a single MOS transistor is required to access the memory element in both the read and write operations.

15 Claims, 11 Drawing Figures

CONVENTIONAL RAM CELL

CONVENTIONAL RAM CELL

CONVENTIONAL RAM CELL

CROSS-COUPLED INVERTERS STATIC RANDOM ACCESS MEMORY

BACKGROUND OF THE INVENTION

The present invention relates to a static random access memory (referred to as RAM hereinbelow) and, more particularly, to a static RAM in which a pair of inverters are cross-coupled to form a memory element of a flip-flop.

Conventional static RAMs comprise memory elements of flip-flops in which a memory operation is enabled in accordance with an ON/OFF application of a current. FIGS. 1(A) to 1(C) show the conventional RAMs in which a pair of inverters are cross-coupled to form a flip-flop as a data storage element. The difference among the cells of FIGS. 1(A) to 1(C) lies in that a load element of the flip-flop is a high resistance element (FIG. 1(A)), an enhancement-type MOS transistor (FIG. 1(B)), and a depletion-type MOS transistor (FIG. 1(C)).

All the cells of FIGS. 1(A) to 1(C) contain two transfer gate MOS transistors for reading/writing data. Each of the transfer gate MOS transistors is allotted to a data line bearing a high level, and another data line bearing a low level signal.

Therefore, it is desired to reduce the number of elements for forming the static RAM to enhance the integration.

SUMMARY OF THE INVENTION

Accordingly, it is an object of the present invention to provide an improved static RAM.

It is another object of the present invention to provide an improved static RAM comprising as few elements as possible.

It is a further object of the present invention to provide an improved circuit for providing an output signal having a level higher than that of a power signal, the circuit being applicable to a driving circuit for a static RAM cell.

Briefly described, in accordance with the present invention, a static RAM comprises a pair of inverters cross-coupled to form a flip-flop as a data memory element, an MOS transistor coupled between the flip-flop and a data line for reading/writing data, and a word line provided for a gate line for the MOS transistor. A signal is applied to the word line which is higher in a writing period than that in a reading period.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

Figure 2A:
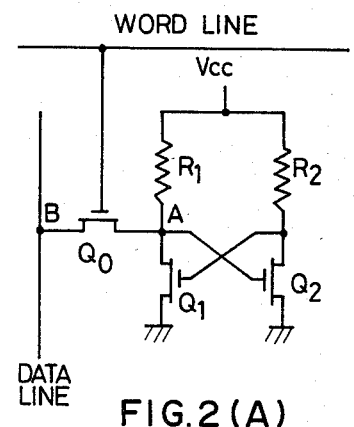
FIGS. 2(A) to 2(C) each show a static RAM cell according to the present invention.
Figure 1B:
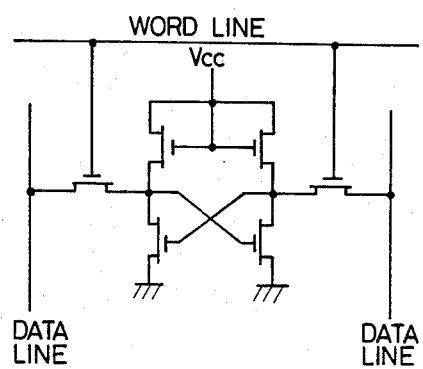
Figure 2B:
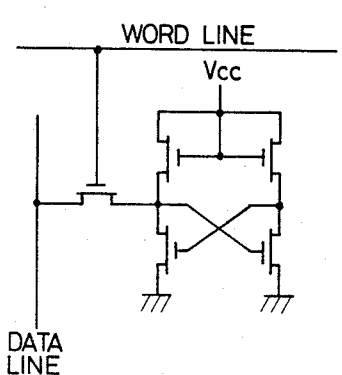
Figure 1C:
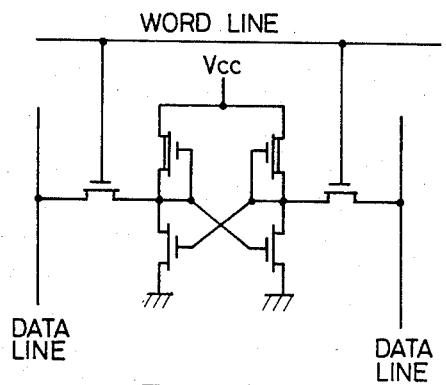
Figure 2C:
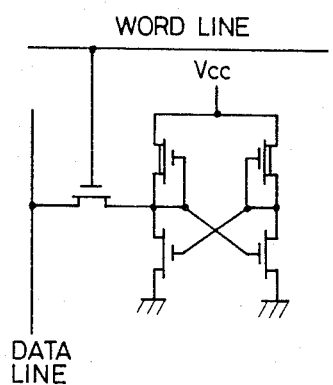

FIGS. 2(A) to 2(C) show static RAM cells according to the present invention. The following description of the present invention is developed in terms of the cell of FIG. 2(A) in which a load element is each of high resistors R1 and R2. The present invention can be adapted to the other cells as shown in FIGS. 2(B) and 2(C).

The RAM cell of FIG. 2(A) comprises a pair of inverters. One of them comprises the high impedance resistor R1 and an MOS transistor Q1. The other of them comprises the high impedance resistor R2 and an MOS transistor Q2. The inverters are cross-coupled to form a flip-flop for storing data. The flip-flop is connected between a power source VCC and the ground.

A single transfer gate MOS transistor Q0 is connected to the flip-flop for reading/writing data. An end of the transfer gate MOS transistor Q0 is connected to a data line for supplying it data to be written and for bearing data read out of the flip-flop. A word line is connected to the gate of the transfer gate MOS transistor Q0.

According to the present invention, the flip-flop for storing data is connected to the data line through the single transfer gate MOS transistor Q0 regardless of whether a high-level signal or a low-level signal is applied to the word line.

Figure 1A:
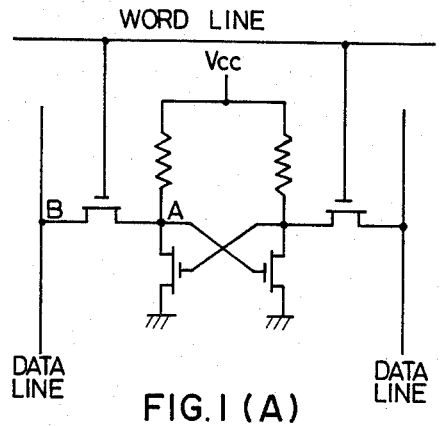
FIGS. 1(A) to 1(C) each show a conventional static RAM cell.

It is difficult to write high-level data to the cell of FIG. 2(A) even when a signal is applied to the word line of FIG. 2(A), the signal being the same as that in the circuit of FIG. 1(A). Therefore, according to the present invention, the level, VW, of a signal on the word line for the data-writing period is higher than the level, VR, of the signal on the word line for a data-reading period. When the level VR of the signal on the word line for the data-reading period is selected to be a level, VCC, of the power source, the level VW of the signal on the word line for the datawriting period is (VCC+VTH) as is apparent from the following description. VTH is a threshold voltage of the transfer gate MOS transistor Q0.

Figure 3:
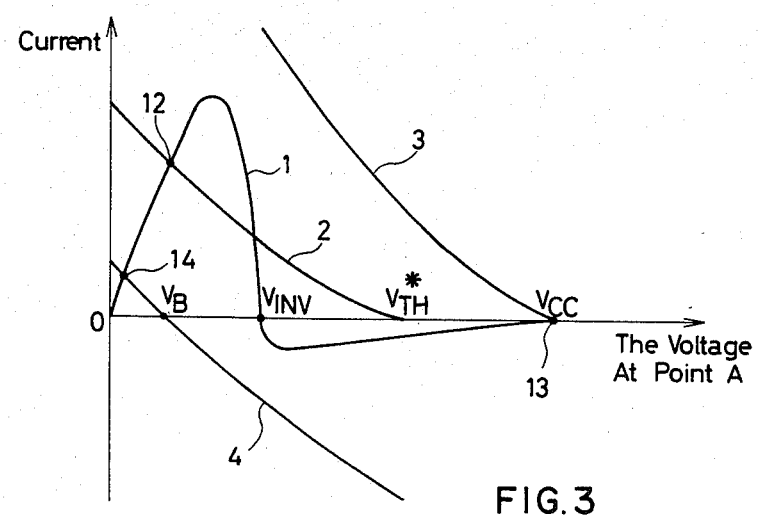
FIG. 3 shows a graph representing the relation of a voltage v. a current in the cell of the present invention.

FIG. 3 shows a graph representing the relation of voltage v. current in the cell of FIG. 2(A). With reference to the graph of FIG. 3, it is described that the signal on the word line having the levels VW and VR are applied to enable the reading/writing operation of data according to the present invention. A curve 1 of the graph of FIG. 3 indicates data on a point A on the flip-flop for storing data when the transfer gate MOS transistor Q0 is neglected. The positive direction of a current is defined as the direction from the point A to the MOS transistor Q1. The curve 1 can be altered depending on the shape of the MOS transistors Q1 and Q2 forming the flip-flop. When the flip-flop is fixed, the curve 1 is determined. As the voltage of the point A increases, the current increases. In the course when the inverter containing the MOS transistor Q2 whose gate is connected to the point A is inverted, an amount of the current is reduced. After it passes the zero, it can flow to the reverse direction, gradually, since the high resistor R1 is connected. It appears a very gradual change until it reaches the zero at a voltage of VCC.

In view of the point A showing the above-described relation, in the flip-flop for storing data, the tranfer gate MOS transistor Q0 is selected to provide an appropriate voltage-current relation, such that operation points can be altered to enable the reading/writing operation, especially, with a high level.

With reference to the cell of FIG. 2(A), the data in the flip-flop is read out as follows:

In the reading period, the signal of VCC is applied to the data line and the word line. The transfer gate MOS transistor Q0 becomes a load for the point A to thereby provide a curve 2 in the graph of FIG. 3. The curve 2 crosses the curve 1 at a point 12 at the lower side and a point 13 at the higher side. This indicates that the reading out operation is stable at the crossed points 12 and 13. When the voltage of the point A is placed low, the crossed point 12 at the lower side provides a stable condition to keep the low voltage of the point A of the flip-flop for storing data. There is no fear that memorized data are destroyed. When the voltage of the point A is placed high, the crossed point 13 at the higher side provides a stable condition, whereby there is no fear that memorized data are destroyed, either.

Thus, in the read operation, with the application of a voltage of VCC on the word line, the data can be read out on the data line without any destruction regardless of whether the data are in a high level or a low level.

The data-writing operation is as follows:

The level of the signal applied to the word line for the writing operation is set to be higher than the level VCC of the signal applied thereto for the reading out operation. This voltage is similar to the level (VCC+VTH) by adding the threshold level VTH of the transfer gate MOS transistor Q0. This leads to a significant change in the voltage-current relation of the transfer gate MOS transistor Q0 curve.

When low-voltage data is written into the flip-flop, the voltage of the data line is placed to be VB. A voltage-current curve of the transfer gate MOS transistor Q0 is a curve 4 as shown in FIG. 4. The curve 4 crosses the curve 1 at a point 14 related to a voltage lower than the low voltage VB. The flip-flop provides a stable condition with the voltage VB inputted to the data line, regardless of initial condition. This means that the low-voltage data are written into the point A of the flip-flop.

When high-voltage data are written into the flip-flop, the voltage VCC is applied to the data line and the voltage (VCC+VTH) is applied to the word line. The curve 3 of the transfer gate MOS transistor Q0 crosses the curve 1 only at the point 13 on the high voltage VCC. This means that the high-level data are written into the point A of the flip-flop.

Thus, the voltages of the transistor and the word line are selected such that each cross appears in the write operation period at the low-voltage side and the high-voltage side between the voltage-current curve of the transfer gate MOS transistor Q0 and the curve for the flip-flop for storing data. The data-reading/writing operation is thus enabled.

To enable the above-described read/write operation, it is required to provide a circuit for generating a word signal having a voltage higher than the voltage of the power source in the writing operation period, and providing a signal having a voltage similar to the voltage of the power source in the reading operation period.

Figure 4A:
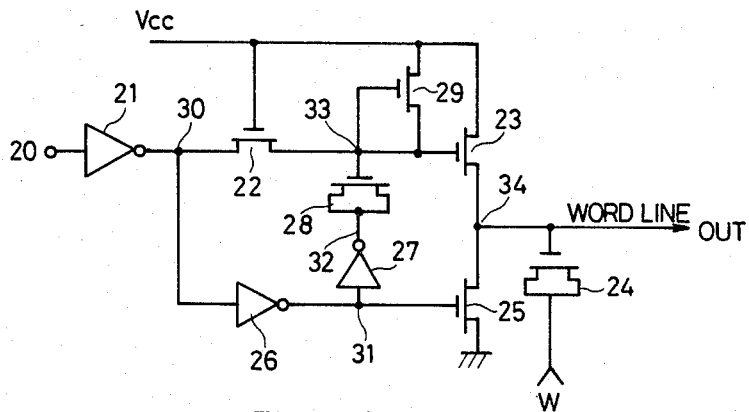
FIG. 4(A) shows a circuit for providing signals applied to a word line according to the present invention.
Figure 4B:
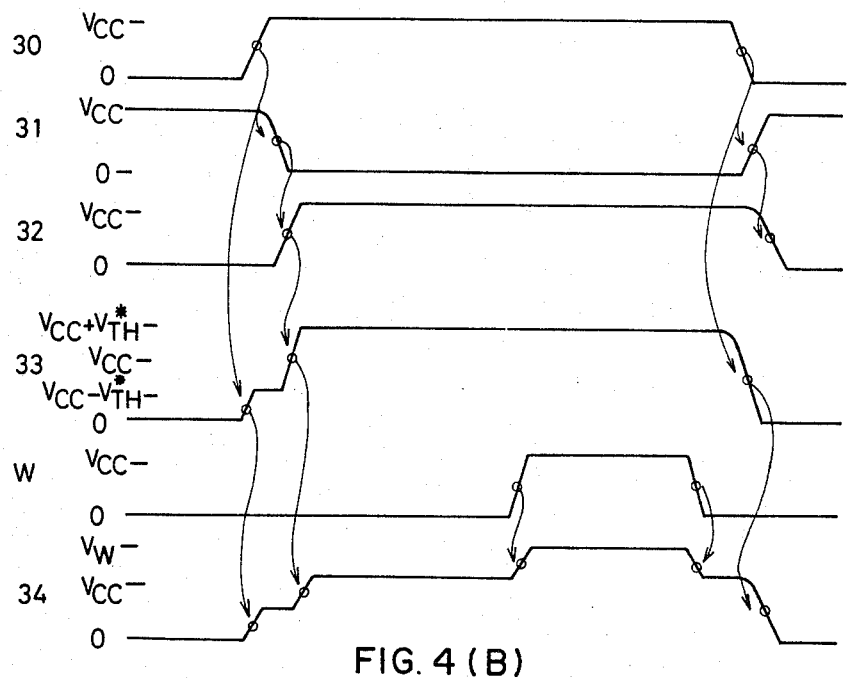
FIG. 4(B) shows a timing chart of signals occurring within the circuit of FIG. 4(A)

FIG. 4(A) shows a specific example of a circuit for generating a word signal. FIG. 4(B) shows a timing chart of signals occurring within the circuit of FIG. 4(A).

With reference to FIG. 4(A), an end of an MOS transistor 22 is connected through an inverter 21 to an input terminal 20 through which a memory cell selecting signal is inputted. The other end of the MOS transistor 22 is coupled to the gate of an enhancement MOS transistor 23. A terminal of the enhancement MOS transistor 23 is connected to a power source of VCC. The other terminal of the transistor 23 is led as an output terminal OUT through which a word signal is outputted. An electrode of a first condenser 24 being an MOS structure is coupled to the terminal OUT for boosting purposes. The writing signal W which is generated only for the writing operation is applied to the other electrode of the first condenser 24. A driving MOS transistor 25 is connected between the end of the enhancement MOS transistor 23 and the ground. A memory select signal is inputted into the gate of the driving MOS transistor 25. The memory select signal is provided by inverting with an inverter 26 an output signal from an inverter 21.

The memory select signal is also applied to an end of a second condenser 28 through an inverter 27 by branching. The second condenser 28 is of an MOS construction. The other end of the second condenser 28 is connected to the connection between an electrode of the MOS transistor 22 and the gate of the enhancement MOS transistor 23. To this connection, the gate and an electrode of an MOS transistor 29 are further connected. The other electrode of the MOS transistor 29 is connected to the power source of VCC. To the power source of VCC, the gate of the MOS transistor 22 and an electrode of the enhancement MOS transistor 23 are further connected.

The memory select signal is applied to the word signal circuit so as to select a RAM cell in the read/write operation. As signal waves 30 to 34 and W of FIG. 4(B) show, the reading signal having the voltage of VCC is led out on the output terminal OUT as shown in signal waves 34 according to the reverse signal 30 outputted by the inverter 21. The writing signal having the voltage of VW is developed in response to the application of the writing signal W at a writing interval timing during the RAM cell selected period.

In the circuit of FIG. 4(A), the MOS transistor 29 is provided such that the source and the drain of the MOS transistor 29 are connected between the power source and the gate of the enhancement MOS transistor 23. The gate of the MOS transistor 29 is connected to the gate of the enhancement MOS transistor 23.

Hence, the voltage of a connection 33 of these two gates must be less than (VCC+VTH*). VTH* is a threshold level of the enhancement MOS transistor 23.

If the voltage of the connection 33 exceeds (VCC+VTH*), the MOS transistor 29 is made conductive so that a current flows toward the power source of VCC until the voltage of the connection 33 reaches (VCC+VTH*).

When the voltage of the connection 33 is (VCC+VTH*), the voltage of a word signal-output line 34 is placed to be about VCC to provide the writing signal W. This leads that the voltage of the word signal-output line 34 is raised toward VW owing to the effect by the first condenser 24. In such a case, the enhancement MOS transistor 23 is cut-off.

Unless the MOS transistor 29 is connected, the voltage of the connection 33 may be (VCC+VTH*). Even if the writing signal W is applied to raise the voltage of the word signal-output line 34, the enhancement MOS transistor 23 is prevented from being cut-off and the voltage of the word signal-output line is placed low.

Figure 5A:
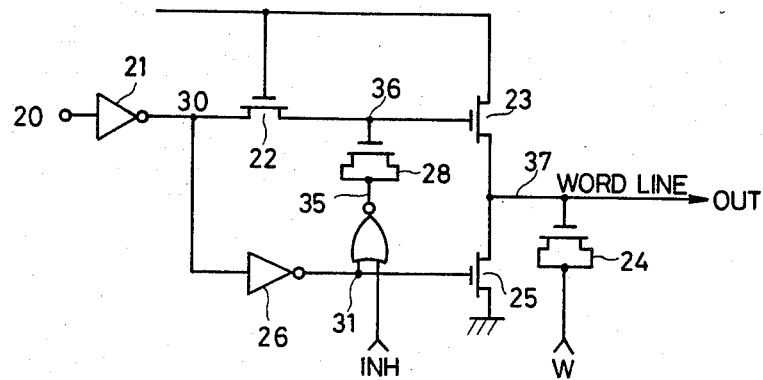
FIG. 5(A) shows a circuit for providing signals applied to the word line according to another specific form of the present invention.
Figure 5B:
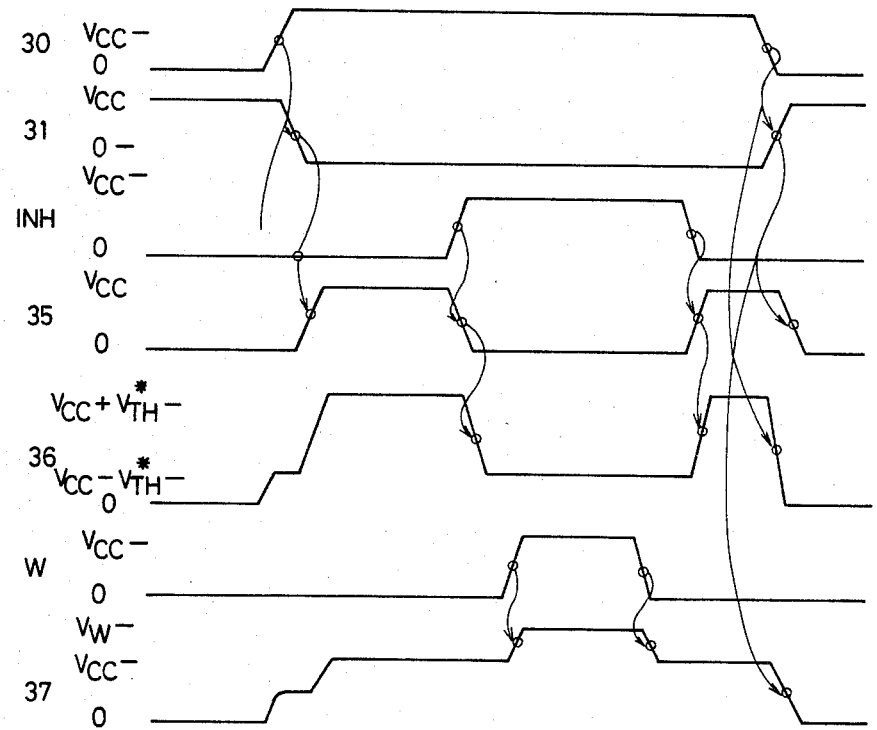
FIG. 5(B) shows a timing chart of signals occurring within the circuit of FIG. 5(A)

FIG. 5(A) shows a word signal circuit according to another specific form of the present invention. FIG. 5(B) shows a timing chart of signals occurring within the circuit of FIG. 5(A).

Instead of the connection of the MOS transistor 29 as indicated in FIG. 4(A), in FIG. 5(A), an NOR gate is connected to an electrode of the second condenser 28 for boosting purposes. An inhibit signal INH is inputted to the NOR gate. The circuit of FIG. 5(A) must be driven with rather complicated timing signals as indicated in FIG. 5(B). In particular, the timing when the enhancement MOS transistor 23 is cut-off must be adequately selected. Otherwise, even if the voltage is boosted with the condensers, the voltage escapes toward the power source side, thereby making it difficult to control the circuit.

In the circuit of FIG. 4(A), the MOS transistor 23 is completely cut-off owing to the effect by the MOS transistor 29. The voltage of an output signal is obtained, exceeding the voltage of the power source, owing to the boosting operation by the first condenser 24.

While only certain embodiments of the present invention have been described, it will be apparent to those skilled in the art that various changes and modifications may be made therein without departing from the spirit and scope of the present invention as claimed.

What is claimed is:

1. A circuit for driving a MOS transistor circuit by generating an output signal having a voltage higher than the voltage of a power source with a boosting operation of a condenser, comprising:
   the power source;
   an output terminal;
   a first enhancement-type MOS transistor connected between the power source and the output terminal;
   a first condenser connected to the gate of the enhancement-type MOS transistor;
   a second enhancement-type MOS transistor connected such that the source and the drain of the second enhancement MOS transistor are coupled to the power source and the gate of the first enhancement-type MOS transistor, and the gate of the second enhancement-type MOS transistor is coupled to the gate of the first enhancement-type MOS transistor; and
   a second condenser connected to the output terminal.

2. A static random access memory (RAM) comprising:
   a flip-flop for storing data, comprising a pair of inverters cross-coupled;
   a data line;
   a single transfer gate MOS transistor connected between the flip-flop and the data line;
   a word line for carrying a signal applied to the gate of the MOS transistor;
   an enhancement-type MOS transistor connected between a power source of VCC and the word line;
   a first condenser connected to the gate of the enhancement-type MOS transistor for providing a voltage of (VCC+VTH*), VTH* being a threshold voltage of the enhancement-type MOS transistor, with a boosting operation according to the application of a RAM selection signal, so that the word line bears a voltage similar to that of the power source;
   a second condenser connected to the word line for providing a voltage VW, which is higher than the voltage of the power source, to the word line with the boosting operation in order to write the data; and
   a MOS transistor connected such that the source and the drain of the MOS transistor are connected to the power source and the gate of the enhancement-type MOS transistor, and the gate of the MOS transistor is connected to the gate of the enhancement-type MOS transistor.

3. A static random access memory cell circuit comprising:
   flip-flop means for storing data therein, said flip-flop means having said data selectively written therein and read therefrom;
   a single data line transferring data to and from said flip-flop means;
   a single transistor means, connected between said flip-flop means and said data line, for controlling the transfer of data to and from said flip-flop means, said single transistor means having a control terminal for receiving a control signal;
   a single word line for supplying said control signal to the control terminal of said single transistor means, said control signal supplied thereby selecting said cell and having a first voltage for enabling the reading of data from said flip-flop means and a second voltage different from said first voltage for writing data into said flip-flop means.

4. The memory cell of claim 3 wherein said flip-flop means comprises a pair of cross-coupled inverters.

5. The memory cell of claim 4 wherein each of said cross-coupled inverters comprises:
   an MOS transistor; and
   a high impedance resistor having a first terminal coupled to said MOS transistor and a second terminal coupled to a source voltage.

6. The memory cell of claim 4 wherein each of said cross-coupled inverters comprises:
   a first MOS transistor; and
   a second MOS transistor of the enhancement type serially connected to said first MOS transistor.

7. The memory cell of claim 4 wherein each of said cross-coupled inverters comprises:
   a first MOS transistor; and
   a second MOS transistor of the depletion type serially connected to said first MOS transistor.

8. The memory cell of claim 3 wherein said single transistor means is a single MOS transistor.

9. The memory cell of claim 3 wherein said flip-flop means is disposed between a source voltage and ground, said first voltage being substantially equal to said source voltage.

10. The memory cell of claim 9 wherein said single transistor means has a threshold voltage which must be supplied to its control terminal to cause conduction between said data line and said flip-flop means;
   said second voltage being substantially equal to said source voltage plus the threshold voltage of said single transistor means.

11. The memory cell of claim 4 wherein said single transistor means is a single MOS transistor.

12. The memory cell of claim 11 wherein said single MOS transistor has a threshold voltage which must be supplied to said control terminal to cause conduction between said data line and said flip-flop means;

said second voltage being substantially equal to said source voltage plus the threshold voltage of said single transistor means.

13. A static random access memory cell circuit consisting essentially of:
flip-flop means for storing data therein, said flip-flop means having said data selectively written therein and read therefrom;
a single data line transferring data to and from said flip-flop means;
a single transistor means, connected between said flip-flop means and said data line, for controlling the transfer of data to and from said flip-flop means, said single transistor means having a control terminal for receiving a control signal;
a single word line for supplying said control signal to the control terminal of said single transistor means, said control signal supplied thereby selecting said cell and enabling the reading of data from said flip-flop means and the writing of data into said flip-flop means.

14. A method of transferring data to and from a static random access memory cell on a single data line under control of a single transistor means for controlling the transfer of said data, said single transistor means having a control terminal connected to a single word line selectively supplying a control signal comprising:
applying said control signal at a first voltage to said control terminal of said single transistor means to facilitate reading from said cell;
applying said control signal at a second voltage greater than said first voltage to facilitate writing in said cell;
the presence of said control signal in said word line selecting said cell for reading or writing.

15. The method of claim 14 wherein said single transistor means is an MOS transistor, said MOS transistor having a threshold voltage which must be supplied to its control terminal to cause conduction thereacross;
said random access memory cell being disposed between a source voltage and ground;
said first voltage being substantially equal to said source voltage;
said second voltage being substantially equal the sum of said source voltage and said threshold voltage.

* * * * *